(12) United States Patent
Zhou et al.

(10) Patent No.: US 10,985,773 B2
(45) Date of Patent: Apr. 20, 2021

(54) ANALOG TO DIGITAL CONVERTING DEVICE AND CAPACITOR ADJUSTING METHOD THEREOF

(71) Applicant: Realtek Semiconductor Corporation, Hsinchu (TW)

(72) Inventors: Xiao-Bo Zhou, Suzhou (CN); Shih-Hsiung Huang, Miaoli County (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/853,970

(22) Filed: Apr. 21, 2020

(65) Prior Publication Data
US 2020/0350922 A1  Nov. 5, 2020

(30) Foreign Application Priority Data

Apr. 30, 2019  (CN) .......................... 201910360962.0

(51) Int. Cl.
  *H03M 1/46*  (2006.01)
  *H03M 1/36*  (2006.01)
(52) U.S. Cl.
  CPC ........... *H03M 1/466* (2013.01); *H03M 1/365* (2013.01)
(58) Field of Classification Search
  CPC ............................. H03M 1/466; H03M 1/365
  USPC ................................................ 341/155–172
  See application file for complete search history.

(56) References Cited

U.S. PATENT DOCUMENTS

| 5,369,407 | A | * | 11/1994 | Yung | H03M 1/008 |
| | | | | | 341/164 |
| 5,581,252 | A | * | 12/1996 | Thomas | H03M 1/466 |
| | | | | | 341/144 |
| 8,599,059 | B1 | * | 12/2013 | Chung | H03M 1/466 |
| | | | | | 341/172 |
| 9,774,345 | B1 | * | 9/2017 | Yoshioka | H03M 1/804 |
| 10,211,847 | B1 | * | 2/2019 | Chung | H03M 1/468 |
| 10,236,901 | B1 | * | 3/2019 | Neto | H03M 1/466 |
| 10,790,847 | B1 | * | 9/2020 | Neto | H03M 1/466 |

(Continued)

FOREIGN PATENT DOCUMENTS

CN   107579740 A   1/2018

OTHER PUBLICATIONS

Chun-Cheng Liu et al., "A 10 bit 320 MS/s Low-Cost SAR ADC for IEEE 802.11ac Applications in 20 nm CMOS", IEEE Journal of Solid-State Circuits, vol. 50, No. 11, Nov. 2015.

(Continued)

*Primary Examiner* — Lam T Mai
(74) *Attorney, Agent, or Firm* — Locke Lord LLP; Tim Tingkang Xia, Esq.

(57) ABSTRACT

An analog to digital converting module includes a comparator, at least one digital to analog convertor, and a reference buffer. The comparator is configured to compare a first input signal and a second input signal so as to output a comparing signal. The at least one at least one digital to analog convertor includes at least one capacitor. The reference buffer is configured to provide a reference signal. The at least one digital to analog convertor receives the reference signal such that a ripple signal is generated according to a change of a voltage of the reference signal. The capacitance of the capacitor of the at least one digital to analog convertor is adjusted based on the ripple signal.

20 Claims, 3 Drawing Sheets

(56) References Cited

U.S. PATENT DOCUMENTS

| | | | | |
|---|---|---|---|---|
| 10,812,098 | B1* | 10/2020 | Vishweshwara | H03M 1/1245 |
| 2006/0187106 | A1* | 8/2006 | Mitra | H03M 1/004 |
| | | | | 341/155 |
| 2011/0260899 | A1* | 10/2011 | Snedeker | H03M 1/1047 |
| | | | | 341/118 |
| 2011/0304493 | A1* | 12/2011 | Mitikiri | H03M 1/462 |
| | | | | 341/150 |
| 2013/0044015 | A1* | 2/2013 | Reinhold | H03M 1/1061 |
| | | | | 341/110 |
| 2013/0169454 | A1* | 7/2013 | Debnath | H03M 1/145 |
| | | | | 341/110 |
| 2015/0263756 | A1* | 9/2015 | Chiu | H03M 1/0607 |
| | | | | 341/118 |

OTHER PUBLICATIONS

Jen-Huan Tsai et al., "A 0.003 mm2 10 b 240 MS/s 0.7 mW SAR ADC in 28 nm CMOS With Digital Error Correction and Correlated-Reversed Switching", IEEE Journal of Solid-State Circuits, vol. 50, No. 6, Jun. 2015.

Chun C. Lee et al., "A 12b 70MS/s SAR ADC with Digital Startup Calibration in 14nm CMOS", Symposium on VLSI Circuits Digest of Technical papers, IEEE, 2015, pp. C62-C63.

Brian P. Ginsburg et al., "An energy-efficient charge recycling approach for a SAR converter with capacitive DAC", 2005 IEEE International Symposium on Circuits and Systems, 2005, pp. 184-187 vol. 1.

Prakash Harikumar et al., "Design of a Reference Voltage Buffer for a 10-bit 50 MS/s SAR AC in 65 nm CMOS", 2015 IEEE International Symposium on Circuits and Systems (ISCAS), 2015, pp. 249-252.

Jan Mulder et al., "An 800MS/s 10b/13b Receiver for 10GBASE-T Ethernet in 28nm CMOS", 2015 IEEE International Solid-State Circuits Conference—(ISSCC) Digest of Technical Papers, 2015.

Chi-Hang Chan et al., "60-dB SNDR 100-MS/s SAR ADCs With Threshold Reconfigurable Reference Error Calibration", IEEE Journal of Solid-State Circuits, vol. 52, No. 10, pp. 2576-2588, Oct. 2017.

* cited by examiner

ANALOG TO DIGITAL CONVERTING DEVICE AND CAPACITOR ADJUSTING METHOD THEREOF

RELATED APPLICATIONS

This application claims priority to China Application Serial Number 201910360962.0, filed Apr. 30, 2019, which is herein incorporated by reference.

BACKGROUND OF THE INVENTION

Field of Invention

The present disclosure relates to a converting device and an adjusting method thereof. More particularly, the present disclosure relates to an analog to digital converting device and a capacitor adjusting method thereof.

Description of Related Art

Since the power consumption of a successive approximation analog-to-digital converter (SAR ADC) is low, the SAR ADC is widely used in wireless electronic communication systems.

However, when using the SAR ADC, electrical charge of a reference voltage provided by a reference buffer is extracted by the SAR ADC resulting in a change in the reference voltage. As a result, when a comparator of the SAR ADC compares a sampling signal and the reference voltage, the comparison result will be wrong.

SUMMARY

The following presents a simplified summary of the disclosure in order to provide a basic understanding to the reader. This summary is not an extensive overview of the disclosure and it does not identify key/critical elements of the present disclosure or delineate the scope of the present disclosure.

One aspect of the present disclosure is directed to an analog to digital converting device. The analog to digital converting device comprises a comparator, at least one digital to analog convertor, and a reference buffer. The comparator is configured to compare a first input signal and a second input signal so as to output a first comparing signal. The at least one digital to analog convertor comprises at least one capacitor. The reference buffer is configured to provide a reference signal, wherein the at least one digital to analog convertor receives the first comparing signal, and couples the at least one capacitor to the reference buffer according to the first comparing signal, wherein the at least one digital to analog convertor receives the reference signal such that a first ripple signal is generated according to a change of a voltage of the reference signal, wherein a capacitance of the at least one capacitor of the at least one digital to analog convertor is adjusted according to the first ripple signal.

Another aspect of the present disclosure is directed to a capacitor adjusting method of an analog to digital converting device, wherein the analog to digital converting device comprises a comparator, at least one digital to analog convertor and a reference buffer, and the at least one digital to analog convertor comprises at least one capacitor, wherein the capacitor adjusting method comprises: comparing, by the comparator, a first input signal and a second input signal so as to output a first comparing signal; providing, by the reference buffer, a reference signal; receiving, by the at least one digital to analog convertor, the first comparing signal, and coupling the at least one capacitor to the reference buffer according to the first comparing signal; receiving, by the at least one digital to analog convertor, the reference signal such that a first ripple signal is generated according to a change of a voltage of the reference signal; and adjusting a capacitance of the at least one capacitor of the at least one digital to analog convertor according to the first ripple signal.

In view of the above embodiments of the present disclosure, it is apparent that the application of the present invention has a number of advantages. In view of the foregoing, embodiments of the present disclosure provide an analog to digital converting device and an adjusting manner of capacitors of the analog to digital converting device, such that error introduced by voltage ripple of a reference voltage Vref can be calculated accurately. Hence, the capacitance of the capacitors in the analog to digital converting device can be compensated by the most accurate redundancy.

These and other features, aspects, and advantages of the present disclosure, as well as the technical means and embodiments employed by the present disclosure, will become better understood with reference to the following description in connection with the accompanying drawings and appended claims.

BRIEF DESCRIPTION OF THE DRAWINGS

The disclosure can be more fully understood by reading the following detailed description of the embodiments, with reference made to the accompanying drawings as follows.

Figure 1:
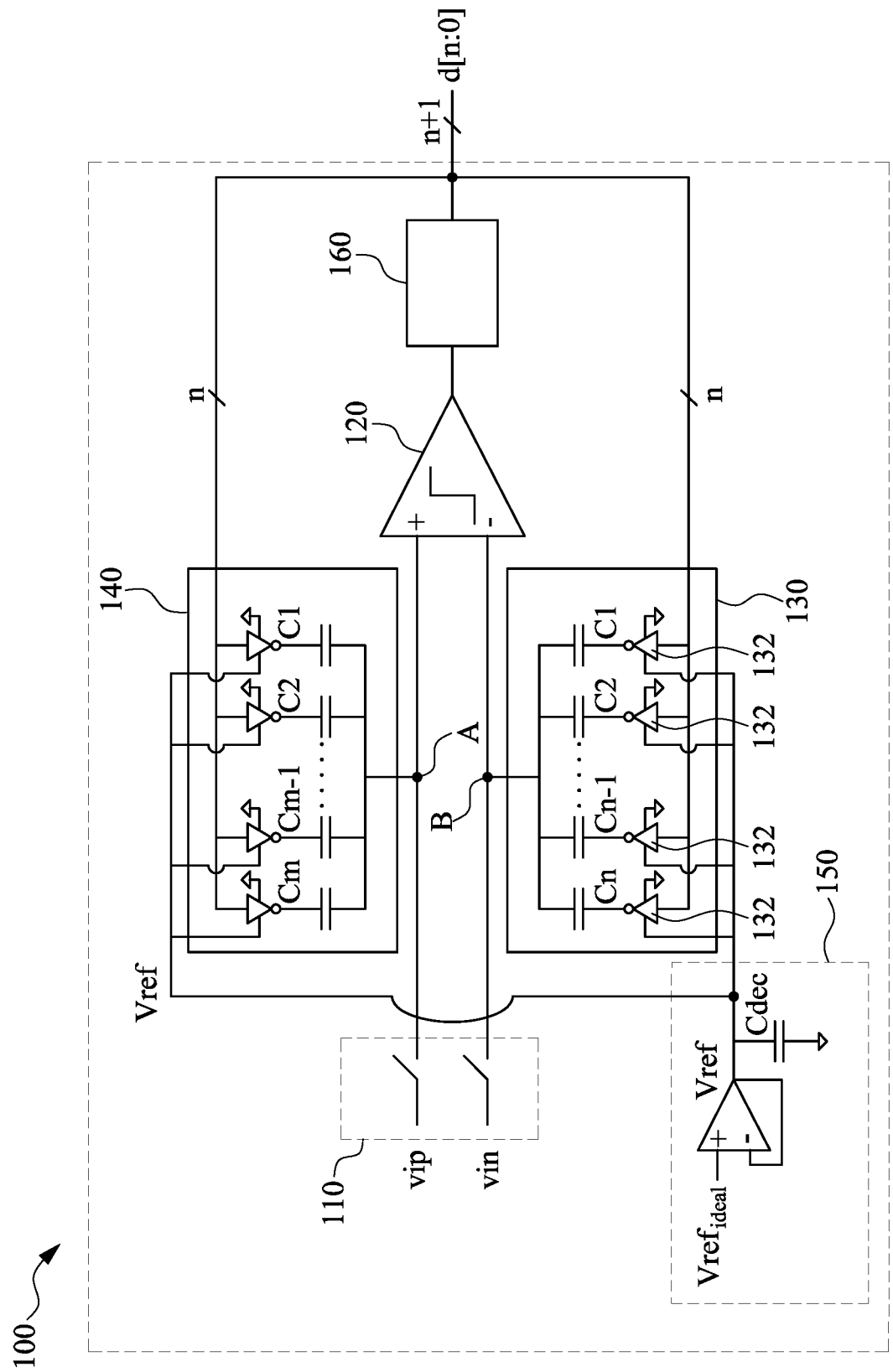
FIG. 1 is a schematic diagram of an analog to digital converting device according to some embodiments of the present disclosure.

In accordance with common practice, the various described features/elements are not drawn to scale but instead are drawn to best illustrate specific features/elements relevant to the present disclosure. Also, wherever possible, like or the same reference numerals are used in the drawings and the description to refer to the same or like parts.

DETAILED DESCRIPTION

The detailed description provided below in connection with the appended drawings is intended as a description of the present examples and is not intended to represent the only forms in which the present examples may be constructed or utilized. The description sets forth the functions of the examples and the sequence of steps for constructing and operating the examples. However, the same or equivalent functions and sequences may be accomplished by different examples.

Unless otherwise defined herein, scientific and technical terminologies employed in the present disclosure shall have the meanings that are commonly understood and used by one of ordinary skill in the art. Unless otherwise required by context, it will be understood that singular terms shall include plural forms of the same and plural terms shall include singular forms of the same.

FIG. 1 is a schematic diagram of an analog to digital converting device 100 according to some embodiments of the present disclosure. As shown in the figure, the analog to digital converting device 100 includes a sampling switch 110, a comparator 120, a digital to analog convertor 130, a digital to analog convertor 140, a reference buffer 150 and a logic circuit 160. In one embodiment, the analog to digital converting device 100 can be, but is not limited to, a successive approximation analog-to-digital converter (SAR ADC). The logic circuit 160 can be, but is not limited to, a successive approximation (SAR) logic circuit, which is configured to output a digital output signal of the analog to digital converting device 100.

With respect to connection, the sampling switch 110 is coupled to the comparator 120. The comparator 120 is coupled to the digital to analog convertor 130, the digital to analog convertor 140 and the logic circuit 160. The digital to analog convertor 130 and the digital to analog convertor 140 are coupled to the reference buffer 150.

With respect to operation, the sampling switch 110 receives a first input signal vip and a second input signal yin, and provides the first input signal vip and the second input signal vin to a first terminal and a second terminal of an input side of the comparator 120 during a sampling period. The first input signal vip and the second input signal yin can be the same direct current voltage or different direct current voltage; however, the present disclosure is not limited thereto. The comparator 120 is configured to compare the first input signal vip and the second input signal yin so as to output a comparing signal to the logic circuit 160. The logic circuit 160 outputs n bit digital output signal sequentially. The digital to analog convertor 130 comprises a plurality of capacitors C1~Cn, the digital to analog convertor 140 comprises a plurality of capacitors C1~Cm, and n and m are positive integers. The plurality of capacitors respectively correspond to capacitors with different bit numbers. The reference buffer 150 provides a reference signal Vref to the digital to analog convertor 130 and the digital to analog convertor 140. The digital to analog convertor 130 and the digital to analog convertor 140 selectively switch the lower plate of each of the capacitors to the reference signal Vref or the reference electrical potential (i.e., ground electrical potential) through respectively coupling the switches 132 (i.e., inverters) of the plurality of capacitors. Each of the switches 132 is selectively switched according to the digital output signal with the Nth bit such that the lower plate of each of the capacitors is coupled to the reference signal Vref or the reference electrical potential. In addition, upper plates of the plurality of capacitors of the digital to analog convertor 130 are coupled to an input terminal B of the comparator 120, and upper plates of the plurality of capacitors of the digital to analog convertor 140 are coupled to an input terminal A of the comparator 120. When a sampling period associated with the sampling switch 110 is over, the analog to digital converting device 100 enters a binary search mode. At this time, the electrical charge of the reference buffer 150 is extracted by the digital to analog convertor 130 (or digital to analog convertor 140), such that a ripple signal is generated according to a change of the voltage of the reference signal Vref. An external computer (not shown) adjusts the capacitance of each of the capacitors of the digital to analog convertor 130 and the digital to analog convertor 140 according to the ripple signal.

In one embodiment, in a first cycle of the binary search mode, the comparator 120 compares the voltage of the input terminal A and the input terminal B. If the voltage of the input terminal A is larger than the voltage of the input terminal B, 1 is output, such that the logic circuit 160 outputs 1. At this time, the lower plate of the most significant bit (MSB) capacitor of the digital to analog convertor 130 is switched to the reference signal Vref of the reference buffer 150. On the other hand, if the voltage of the input terminal A is less than the voltage of the input terminal B, the comparator 120 outputs 0, such that the logic circuit 160 outputs 0. At this time, the MSB capacitor of the digital to analog convertor 140 is switched to the reference signal Vref of the reference buffer 150. In the following cycles, the capacitor corresponding to each bit is switched to the reference signal Vref or the reference electrical potential according to the digital output signal of the logic circuit 160 until the least significant bit (LSB). The logic circuit 160 outputs the digital output signal d[n:0] in turn. Details of the binary search mode will not be described herein since the binary search mode is known to those of ordinary skill in the art. It is noted that, in the following description, switching the digital to analog convertor 130 to the reference buffer 150 is used as an example; however, switching the digital to analog convertor 140 to the reference buffer 150 is also within the scope of the present disclosure.

Figure 2:
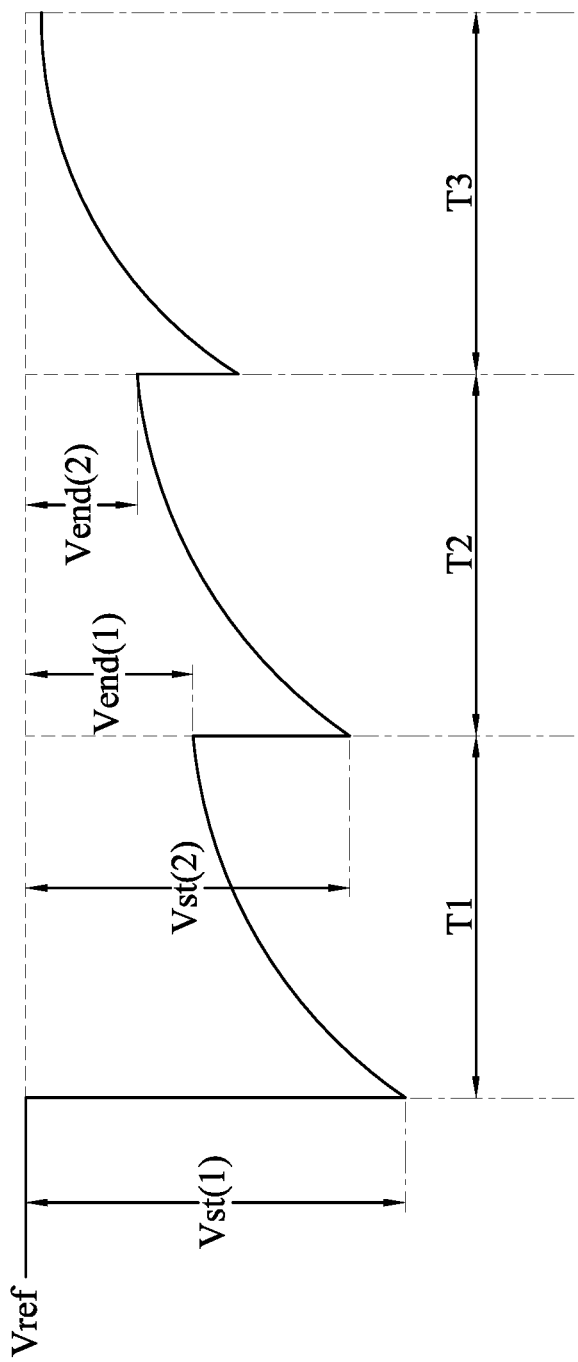
FIG. 2 is an output waveform diagram of the analog to digital converting device as shown in FIG. 1 according to some embodiments of the present disclosure.

FIG. 2 is an output waveform diagram of the reference buffer 150 of the analog to digital converting device 100 as shown in FIG. 1 according to some embodiments of the present disclosure, which is a waveform diagram of the reference signal Vref. Because the electrical charge of the reference buffer 150 is extracted by the digital to analog convertor 130 and the digital to analog convertor 140, the voltage of the reference signal Vref changes (e.g., the voltage of the reference signal Vref drops). The ripple signal includes a first ripple section, a second ripple section and a third ripple section, and the above-mentioned sections are respectively located at a first period T1, a second period T2 and a third period T3. It is noted that the ripple signal including the first ripple section, the second ripple section and the third ripple section as shown in FIG. 2 is used as an example; however, the number of ripple periods can be increased depending on actual requirements.

When the reference buffer 150 provides the reference signal Vref to the digital to analog convertor 130, in a first cycle, the electrical charge of the reference buffer 150 is extracted by the digital to analog convertor 130 resulting in a first start voltage drop Vst (1) of the first ripple section. The external computer (not shown) is configured to calculate the first start voltage drop Vst(1). Subsequently, the reference signal Vref increases gradually, and a first end voltage drop Vend(1) as shown in FIG. 2 is therefore formed. The external computer calculates the first end voltage drop Vend (1). At the same time, the external computer calculates a first input error of the first ripple section according to the actual reference voltage value Vref of the ripple signal in an end of the first ripple section.

The first start voltage drop Vst (1) can be calculated by the following formula:

$$Vst(1) = Q(1)/Cdec \qquad \text{formula 1}$$

In formula 1, Q(1) is the electrical charge which is extracted from the reference signal Vref at the beginning of the first ripple section T1, and Cdec is the capacitance of the output capacitor of the reference buffer 150 as shown in FIG. 1.

The first end voltage drop Vend (1) can be calculated by the following formula:

$$Vend(1) = Vst(1) * \exp[-T1/\tau(1)] \qquad \text{formula 2}$$

In formula 2, T1 is a time length of the first ripple section, and $\tau(1)$ is the settling time of the first ripple section reference voltage. In addition to Vst (1) and Vend (1), the values of the reference voltage Vref at every instance of the first ripple section can be calculated by the above-mentioned formula. In the formula, time coefficient $\tau(n)$ can be calculated by the following formula:

$$\tau(n)=Rout*[Cdec+Cp,\text{ref}(n)]/(C\text{total}-Cp,\text{ref}(n)+Cn,\text{ref}(n))/(C\text{total}-Cn,\text{ref}(n))] \quad \text{formula 3}$$

In formula 3, Rout is the output impedance of the reference buffer 150 as shown in FIG. 1; Cdec is the capacitance of the output capacitor of the reference buffer 150; $C_{p,ref(n)}$ is a total capacitance of a positive terminal of the comparator 120 coupled to the reference buffer 150 during the Nth ripple period; and $C_{n,ref(n)}$ is a total capacitance of a negative terminal of the comparator 120 coupled to the reference buffer 150 during the Nth ripple period. Moreover, Ctotal is a total capacitance of the digital to analog convertor 130 or the digital to analog convertor 140.

In addition, at the end of the first ripple section, the comparator will perform a determination process, and the external computer calculates the first input error according to the actual reference voltage value and part of the capacitance values of the first capacitors C1~Cn and the second capacitors C1~Cm when the comparator 120 is performing the determination process. The first input error can be calculated by the following formula:

$$\text{Error}(n)=[Vref_{ideal}-Vref(n)]*[Cp,\text{ref}(n)/C\text{total}-Cn,\text{ref}(n)-C\text{total}] \quad \text{formula 4}$$

In formula 4, n indicates that it is in the Nth ripple period, Error(1) is the first input error, $Vref_{ideal}$ is the ideal reference signal of the input reference buffer 150, and Vref(n) is the actual reference signal (i.e., the ripple signal) when the comparator 120 is performing the determination process at the end of the Nth ripple period. In formula 4, an input error Error(n) is calculated according to a difference of the actual reference signal Vref(n) (i.e., the ripple signal) and the ideal reference signal $Vref_{ideal}$ which is voltage divided by the at least one capacitor of the digital to analog convertor 130 and the analog convertor 140. The input error as shown in formula 4 is the error value generated at terminal A and terminal B of the input side of the comparator 120 by the dividing of the at least one capacitor of the digital to analog convertor 130 and the analog convertor 140.

In one embodiment, referring to both FIG. 1 and FIG. 2, in the second cycle, the external computer calculates a second start voltage drop Vst(2) of the second ripple section, and calculates a second end voltage drop Vend(2). At the same time, the external computer calculates a second input error of the second ripple section according to the actual reference voltage value when the comparator 120 is performing the determination process at the end of the second ripple section.

The second start voltage drop Vst(2) can be calculated by the following formula:

$$Vst(2)=Vend(1)+Q(2)/Cdec \quad \text{formula 5}$$

In formula 5, Q(2) is the electrical charge extracted from the reference signal Vref at the beginning of the second period T2 and Cdec is the capacitance of the output capacitor of the reference buffer 150 as shown in FIG. 1.

The second end voltage drop Vend(2) can be calculated by the following formula:

$$Vend(2)=Vst(2)*\exp[-T2/\tau(2)] \quad \text{formula 6}$$

In formula 6, T2 is a time length of the second ripple section, and $\tau(2)$ is the settling time of the second ripple section reference voltage. In addition to Vst(2) and Vend(2), the values of the reference voltage Vref at every instance of the second ripple section can be calculated by the above-mentioned formula.

Similarly, the external computer calculates the second input error according to the actual reference voltage value when the comparator 120 is performing the determination process at the end of the second ripple section, and capacitances of part of the first capacitors C1~Cn and the second capacitors C1~Cm. The manner in which the second input error is calculated is as shown in the formula 4.

As a result, a plurality of error values (i.e., the first input error Error(1) and the second input error Error(2)) can be obtained, and the external computer adjusts capacitances of the first capacitors C1~Cn of the first digital to analog convertor 130 and capacitances of the second capacitors C1~Cm of the second digital to analog convertor 140 according to the error values. For instance, an analog to digital converting device with 4 bits is used herein as an example. The first digital to analog convertor 130 includes a capacitor C1, a capacitor C2, a capacitor C3 and a capacitor C4. Capacitance values of the initial C1, C2, C3 and C4 can be one times capacitance value (1C), one times capacitance value (1C), two times capacitance value (2C), and four times capacitance value (4C) respectively. The external computer adjusts capacitance values of the capacitors as follows:

$$C1=1C \quad \text{formula 7}$$

$$C2=1C \quad \text{formula 8}$$

$$C3=C1+C2-C\text{total}*\text{Error}(2)/Vref \quad \text{formula 9}$$

$$C4=C1+C2+C3-C\text{total}*\text{Error}(1)/Vref \quad \text{formula 10}$$

Subsequently, new capacitance values are adopted, and the external computer calculates the first end voltage drop of the first ripple section according to the first start voltage drop, and calculates the first input error according to the actual reference voltage value and part of the capacitance values of the first capacitors and the second capacitors when the comparator 120 is performing the determination process at the end of the first ripple section. Subsequently, the external computer calculates the second end voltage drop of the second ripple section according to the second start voltage drop, and calculates the second input error according to the actual reference voltage value and part of the capacitance values of the first capacitors and the second capacitors when the comparator 120 is performing the determination process at the end of the second ripple section. As a result, a new capacitance value can be obtained, and the external computer will repeat the foregoing processes until the capacitance value converges.

In addition, since different input signals correspond to different capacitor configurations, the external computer performs a Fast Fourier Transform (FFT) with respect to the digital output signal d[n:0] of the logic circuit 160 in different input situations in order to find a configuration which may generate a digital output signal with the biggest signal-to-noise ratio (SNR) among the capacitor configurations. The configuration is the best capacitor configuration. In another embodiment, the external computer may perform a rounding process with respect to the capacitances of the first capacitors and the second capacitors for obtaining integers.

Figure 3:
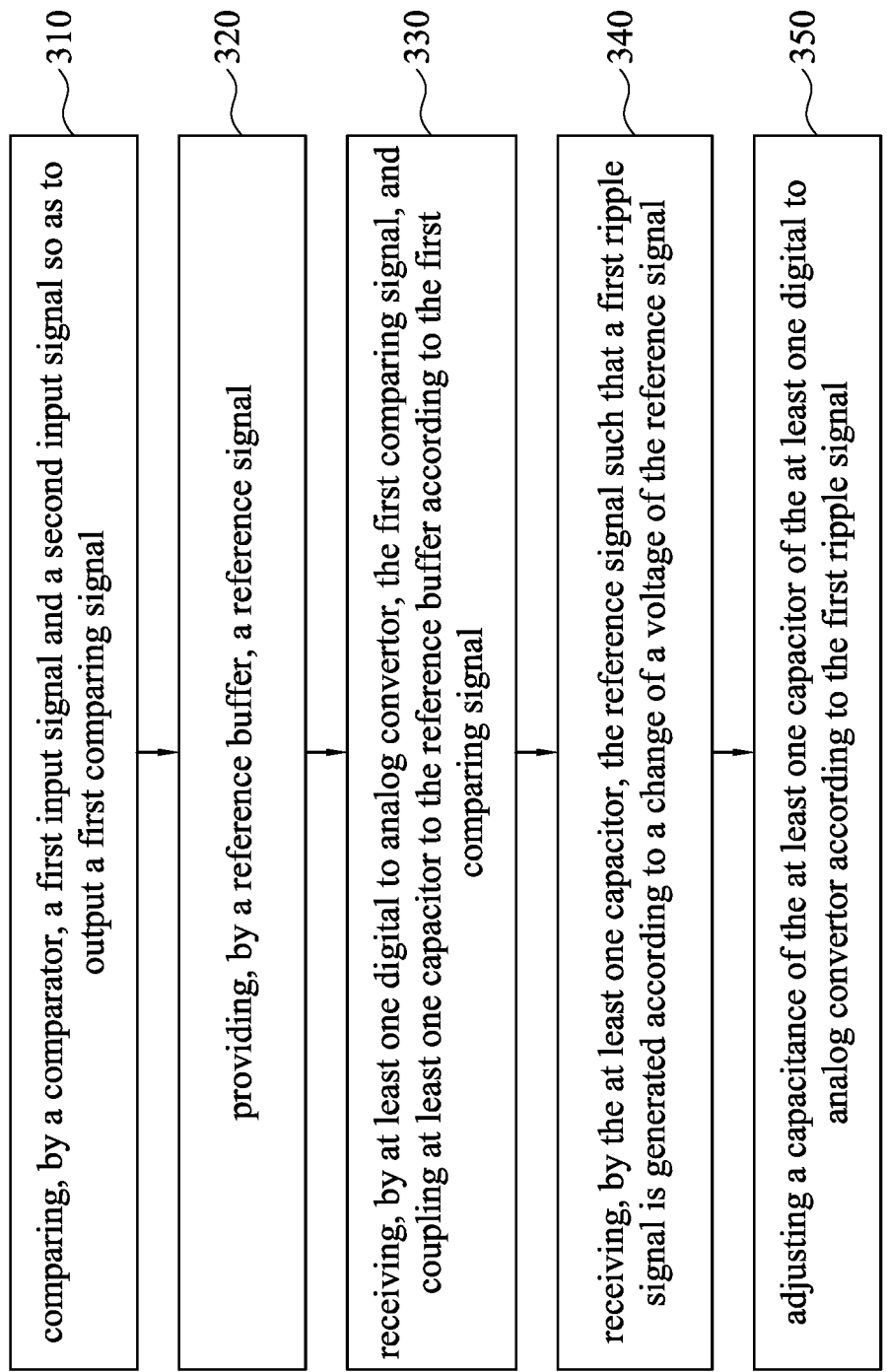
FIG. 3 is a flow diagram of a capacitor adjusting method of an analog to digital converting device according to some embodiments of the present disclosure.

FIG. 3 is a flow diagram of a capacitor adjusting method of an analog to digital converting device according to some embodiments of the present disclosure.

Step 310: comparing, by a comparator, a first input signal and a second input signal so as to output a first comparing signal;

Step 320: providing, by a reference buffer, a reference signal;

Step 330: receiving, by at least one digital to analog convertor, the first comparing signal, and coupling at least one capacitor to the reference buffer according to the first comparing signal;

Step 340: receiving, by the at least one capacitor, the reference signal such that a first ripple signal is generated according to a change of a voltage of the reference signal; and Step 350: adjusting a capacitance of the at feast one capacitor of the at least one digital to analog convertor according to the first ripple signal.

For facilitating the understanding of the capacitor adjusting method of the analog to digital converting device, reference is now made to FIG. 1, FIG. 2, and FIG. 3. It is noted that except for those steps whose sequences have been indicated, the sequences of the steps as mentioned in the embodiment can be adjusted according to actual requirements. For example, the sequential order of the steps can be adjusted, the steps can be performed simultaneously, or part of the steps can be performed simultaneously. In step 310, the comparator 120 compares the first input signal vip and the second input signal yin so as to output the first comparing signal. For instance, the sampling switch 110 receives the first input signal vip and the second input signal yin during the sampling period, and provides the first input signal vip and the second input signal vin to the comparator 120. The comparator 120 compares the first input signal vip and the second input signal yin so as to output the comparing signal. Other operations regarding step 310 are described in detail in the foregoing embodiments, and a description of such operations will not be repeated herein for the sake of brevity.

In step 320, the reference buffer 150 provides the reference signal Vref.

In step 330, the at least one digital to analog convertor 130 receives the first comparing signal and couples the at least one capacitor (C1~Cn) to the reference buffer 150 according to the first comparing signal. For instance, the digital to analog convertor 130 and the digital to analog convertor 140 selectively switch the lower plate of each of the capacitors to the reference signal Vref or the reference electrical potential (i.e., ground) by the switches 132 (i.e., inverters) which are coupled to a plurality of capacitors respectively.

In step 340, the at least one digital to analog convertor 130 receives the reference signal Vref such that a first ripple signal is generated according to a change of the voltage of the reference signal Vref. For instance, the analog to digital converting device 100 performs a binary searching mode when the sampling period of the sampling switch 110 is finished. At this time, the digital to analog convertor 130 (140) will extract energy of the reference buffer 150 such that the first ripple signal is generated according to a change of the voltage of the reference signal Vref.

In step 350, the capacitance of the at least one capacitor (C1~Cn) of the at least one digital to analog convertor 130 is adjusted according to the first ripple signal. In one embodiment, the external computer adjusts the capacitance of each of the capacitors of the digital to analog convertor 130 and the digital to analog convertor 140 according to the ripple signal.

In one embodiment, the first ripple signal as shown in FIG. 2 includes the first ripple section, the second ripple section and the third ripple section, and the above-mentioned sections are respectively located at the first period T1, the second period T2 and the third period T3. The capacitor adjusting method includes the external computer calculating the first input error of the first ripple section according to the actual reference voltage value Vref of the first ripple signal when the comparator is performing the determination process at the end of the first ripple period. Other operations are described in detail in the foregoing embodiments, and a description of such operations will not be repeated herein for the sake of brevity.

In another embodiment, the capacitor adjusting method includes the external computer calculating the first input error according to the actual reference voltage value and part of the capacitance values of the first capacitors C1~Cn and the second capacitors C1~Cm when the comparator 120 is performing the determination process at the end of the first ripple section. The first input error can be calculated by formula 4 as described above. Other operations are described in detail in the foregoing embodiments, and a description of such operations will not be repeated herein for the sake of brevity.

In one embodiment, the capacitor adjusting method further includes the external computer adjusting the capacitances of the first capacitors C1~Cn of the first digital to analog convertor 130 and the second capacitors C1~Cm of the second digital to analog convertor 140 according to the first input error.

In another embodiment, the capacitor adjusting method includes the external computer calculating the second input error of the second ripple section according to the actual reference voltage value of the second ripple signal when the comparator is performing the determination process at the end of the second ripple section. Other operations are described in detail in the foregoing embodiments, and a description of such operations will not be repeated herein for the sake of brevity.

In another embodiment, the capacitor adjusting method includes the external computer calculating the second input error according to the actual reference voltage value when the comparator is performing the determination process at the end of the second ripple section and the capacitances of part of the first capacitors C1~Cn and the second capacitors C1~Cm.

In one embodiment, the capacitor adjusting method further includes the external computer adjusting the capacitances of the first capacitors C1~Cn of the first digital to analog convertor 130 and the capacitances of the second capacitors C1~Cms of the second digital to analog convertor 140 according to the second input error value. Other operations are described in detail in the foregoing embodiments, and a description of such operations will not be repeated herein for the sake of brevity.

In one embodiment, the capacitor adjusting method includes, after the capacitances of the first capacitors C1~Cn of the first digital to analog convertor 130 and the capacitances of the second capacitors C1~Cm of the second digital to analog convertor 140 are adjusted, utilizing new capacitance values, and the external computer calculating the first end voltage drop of the first ripple section according to the first start voltage drop, and calculating the first input error according to the actual reference voltage value and part of the capacitance values of the first capacitors and the second capacitors when the comparator 120 is performing the determination process at the end of the first ripple section. Subsequently, the external computer calculates the second end voltage drop of the second ripple section according to the second start voltage drop, and calculates the second input error according to the actual reference voltage value and part of the capacitance values of the first capacitors and the second capacitors when the comparator is performing the determination process at the end of the second ripple section. As a result, a new capacitance value can be obtained, and the external computer will repeat the foregoing processes until the capacitance value converges.

In one embodiment, the capacitor adjusting method includes the external computer performing a Fast Fourier Transform (FFT) with respect to the digital output signal d[n:0] outputted by the analog to digital converter 100 in different input situations in order to find a configuration which may generate a digital output signal with the biggest signal-to-noise ratio (SNR) among the capacitor configurations. The configuration is the best capacitor configuration.

In view of the above embodiments of the present disclosure, it is apparent that the application of the present invention has a number of advantages. In view of the foregoing, embodiments of the present disclosure provide an analog to digital converting device and an adjusting manner of capacitors of the analog to digital converting device, such that error introduced by voltage ripple of a reference voltage Vref can be calculated by the above-mentioned formulas accurately. Referring to formulas 9 and 10, the terms of Ctotal*Error(2)/Vref and Ctotal*Error(1)/Vref and in the formulas are redundancies which are calculated accurately. Hence, the capacitance of the capacitor can be adjusted accurately, and the most accurate redundancy can be used to perform a compensation process.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. An analog to digital converting device, comprising:
a comparator configured to compare a first input signal and a second input signal so as to output a first comparing signal;
at least one digital to analog convertor comprising at least one capacitor; and
a reference buffer configured to provide a reference signal, wherein the at least one digital to analog convertor receives the first comparing signal, and couples the at least one capacitor to the reference buffer according to the first comparing signal, wherein the at least one capacitor receives the reference signal such that a first ripple signal is generated according to a change of a voltage of the reference signal, wherein a capacitance of the at least one capacitor of the at least one digital to analog convertor is adjusted according to the first ripple signal.

2. The analog to digital converting device of claim 1, wherein the at least one digital to analog convertor comprises at least one switch, wherein the at least one switch receives the first comparing signal, and couples the at least one capacitor to the reference signal or a reference electrical potential according to the first comparing signal.

3. The analog to digital converting device of claim 1, wherein a first input error is calculated according to a first difference value of the first ripple signal and an ideal reference signal, and the first input error is an error value which is voltage divided by the at least one capacitor of the at least one digital to analog convertor and generated at an input side of the comparator, wherein the capacitance of the at least one capacitor of the at least one digital to analog convertor is adjusted according to the first input error.

4. The analog to digital converting device of claim 3, wherein the at least one digital to analog convertor comprises a plurality of capacitors, wherein the comparator outputs a second comparing signal according to the first input signal and the second input signal, wherein the at least one digital to analog convertor receives the second comparing signal, and couples at least one of the capacitors to the reference buffer according to the second comparing signal, wherein the at least one of the capacitors receives the reference signal, such that a second ripple signal is generated according to a change of the voltage of the reference signal, wherein the capacitance of the at least one of the capacitors of the at least one digital to analog convertor is adjusted according to the second ripple signal.

5. The analog to digital converting device of claim 4, wherein the first ripple signal comprises a first ripple section, wherein the first input error is calculated according to the first difference value of a first value of the first ripple signal in an end of the first ripple section and the ideal reference signal.

6. The analog to digital converting device of claim 5, wherein a second input error is calculated according to a second difference value of the second ripple signal and the ideal reference signal, and the second input error is the error value which is voltage divided by the capacitors of the at least one digital to analog convertor and generated at the input side of the comparator, wherein the capacitance of the at least one of the capacitors of the at least one digital to analog convertor is adjusted according to the second input error.

7. The analog to digital converting device of claim 6, wherein the second ripple signal comprises a second ripple section, wherein the second input error is calculated according to the second difference value of a second value of the second ripple signal in an end of the second ripple section and the ideal reference signal.

8. The analog to digital converting device of claim 7, wherein the at least one digital to analog convertor comprises a first digital to analog convertor and a second digital to analog convertor, wherein the first digital to analog convertor is coupled to a first terminal of the input side of the comparator, and the second digital to analog convertor is coupled to a second terminal of the input side of the comparator, wherein each of the first digital to analog convertor and the second digital to analog convertor comprises a plurality of capacitors.

9. The analog to digital converting device of claim 8, wherein during the first ripple section, the first input error is calculated according to the first difference value, a first capacitance value of the first terminal of the comparator coupled to the reference buffer, a second capacitance value of the second terminal of the comparator coupled to the reference buffer, and a total capacitance value of the first digital to analog convertor or the second digital to analog convertor.

10. The analog to digital converting device of claim 9, wherein during the second ripple section, the second input error is calculated according to the second difference value, the first capacitance value of the first terminal of the comparator coupled to the reference buffer, the second capacitance value of the second terminal of the comparator coupled to the reference buffer, and the total capacitance value of the first digital to analog convertor or the second digital to analog convertor.

11. A capacitor adjusting method of an analog to digital converting device, wherein the analog to digital converting device comprises a comparator, at least one digital to analog convertor and a reference buffer, and the at least one digital to analog convertor comprises at least one capacitor, wherein the capacitor adjusting method comprises:
  comparing, by the comparator, a first input signal and a second input signal so as to output a first comparing signal;
  providing, by the reference buffer, a reference signal;
  receiving, by the at least one digital to analog convertor, the first comparing signal, and coupling the at least one capacitor to the reference buffer according to the first comparing signal;
  receiving, by the at least one capacitor, the reference signal such that a first ripple signal is generated according to a change of a voltage of the reference signal; and
  adjusting a capacitance of the at least one capacitor of the at least one digital to analog convertor according to the first ripple signal.

12. The capacitor adjusting method of claim 11, wherein the step of receiving, by the at least one digital to analog convertor, the first comparing signal, and coupling the at least one capacitor to the reference buffer according to the first comparing signal comprises:
  receiving, by at least one switch of the at least one digital to analog convertor, the first comparing signal, and coupling the at least one capacitor to the reference signal or a reference electrical potential according to the first comparing signal.

13. The capacitor adjusting method of claim 11, wherein the step of adjusting the capacitance of the at least one capacitor of the at least one digital to analog convertor according to the first ripple signal comprises:
  calculating a first input error according to a first difference value of the first ripple signal and an ideal reference signal, wherein the first input error is an error value which is voltage divided by the at least one capacitor of the at least one digital to analog convertor and generated at an input side of the comparator; and
  adjusting the capacitance of the at least one capacitor of the at least one digital to analog convertor according to the first input error.

14. The capacitor adjusting method of claim 13, wherein the at least one digital to analog convertor comprises a plurality of capacitors, wherein the capacitor adjusting method further comprises:
  outputting, by the comparator, a second comparing signal according to the first input signal and the second input signal;
  receiving, by the at least one digital to analog convertor, the second comparing signal, and coupling at least one of the capacitors to the reference buffer according to the second comparing signal;
  receiving, by the at least one of the capacitors, the reference signal such that a second ripple signal is generated according to a change of the voltage of the reference signal; and
  adjusting the capacitance of the at least one of the capacitors of the at least one digital to analog convertor according to the second ripple signal.

15. The capacitor adjusting method of claim 14, wherein the first ripple signal comprises a first ripple section, wherein the step of calculating the first input error according to the first difference value of the first ripple signal and the ideal reference signal comprises:
  calculating the first input error according to the first difference value of a first value of the first ripple signal in an end of the first ripple section and the ideal reference signal.

16. The capacitor adjusting method of claim 15, wherein the step of adjusting the capacitance of the at least one of the capacitors of the at least one digital to analog convertor according to the second ripple signal comprises:
  calculating a second input error according to a second difference value of the second ripple signal and the ideal reference signal, wherein the second input error is the error value which is voltage divided by the capacitors of the at least one digital to analog convertor and generated at the input side of the comparator; and
  adjusting the capacitance of the at least one of the capacitors of the at least one digital to analog convertor according to the second input error.

17. The capacitor adjusting method of claim 16, wherein the second ripple signal comprises a second ripple section, wherein the step of calculating the second input error according to the second ripple signal and the second difference value of the ideal reference signal comprises:
  calculating the second input error according to the second difference value of a second value of the second ripple signal in an end of the second ripple section and the ideal reference signal.

18. The capacitor adjusting method of claim 17, wherein the at least one digital to analog convertor comprises a first digital to analog convertor and a second digital to analog convertor, wherein the first digital to analog convertor is coupled to a first terminal of the input side of the comparator, and the second digital to analog convertor is coupled to a second terminal of the input side of the comparator, wherein each of the first digital to analog convertor and the second digital to analog convertor comprises a plurality of capacitors.

19. The capacitor adjusting method of claim 18, wherein during the first ripple section, the first input error is calculated according to the first difference value, a first capacitance value of the first terminal of the comparator coupled to the reference buffer, a second capacitance value of the second terminal of the comparator coupled to the reference buffer, and a total capacitance value of the first digital to analog convertor or the second digital to analog convertor.

20. The capacitor adjusting method of claim 19, wherein during the second ripple section, the second input error is calculated according to the second difference value, the first capacitance value of the first terminal of the comparator coupled to the reference buffer, the second capacitance value of the second terminal of the comparator coupled to the reference buffer, and a total capacitance value of the first digital to analog convertor or the second digital to analog convertor.

* * * * *